(12) United States Patent
Kasko et al.

(10) Patent No.: US 7,374,952 B2
(45) Date of Patent: *May 20, 2008

(54) METHODS OF PATTERNING A MAGNETIC STACK OF A MAGNETIC MEMORY CELL AND STRUCTURES THEREOF

(75) Inventors: Ihar Kasko, Mennecy (FR); Sivananda K. Kanakasabapathy, Hopewell Junction, NY (US); Gregory Costrini, Hopewell Junction, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 234 days.

This patent is subject to a terminal disclaimer.

(21) Appl. No.: 10/870,756

(22) Filed: Jun. 17, 2004

(65) Prior Publication Data

US 2005/0280040 A1    Dec. 22, 2005

(51) Int. Cl.
*H01L 21/00* (2006.01)
(52) U.S. Cl. .................... 438/3; 257/295; 257/E27.104
(58) Field of Classification Search .................... 438/3; 257/E21.208
See application file for complete search history.

(56) References Cited

U.S. PATENT DOCUMENTS

| | | | |
|---|---|---|---|
| 5,650,958 A | 7/1997 | Gallagher et al. | |
| 5,940,319 A | 8/1999 | Durlam et al. | |
| 6,153,443 A | 11/2000 | Durlam et al. | |
| 6,365,419 B1 | 4/2002 | Durlam et al. | |
| 6,426,012 B1 | 7/2002 | O'Sullivan et al. | |
| 6,518,588 B1 | 2/2003 | Parkin et al. | |
| 6,555,858 B1 | 4/2003 | Jones et al. | |
| 6,638,774 B2 | 10/2003 | Raberg | |
| 6,656,372 B2 | 12/2003 | Yates | |
| 6,703,676 B2 | 3/2004 | Hirai et al. | |
| 6,709,874 B2 | 3/2004 | Ning | |
| 6,713,802 B1 | 3/2004 | Lee | |
| 6,783,995 B2 | 8/2004 | Hineman et al. | |
| 6,927,467 B2 | 8/2005 | Kim | |
| 7,001,783 B2 * | 2/2006 | Costrini et al. ................. | 438/3 |
| 7,064,974 B2 | 6/2006 | Suzuki et al. | |
| 2003/0068897 A1 | 4/2003 | Yates | |
| 2004/0026369 A1 | 2/2004 | Ying et al. | |
| 2004/0043579 A1 | 3/2004 | Nuetzel et al. | |
| 2004/0084400 A1 | 5/2004 | Costrini et al. | |
| 2004/0229430 A1 * | 11/2004 | Findels et al. | |
| 2005/0282295 A1 | 12/2005 | Raberg | |
| 2006/0051881 A1 | 3/2006 | Ditizio | |

* cited by examiner

*Primary Examiner*—Jerome Jackson
*Assistant Examiner*—José R Diaz
(74) *Attorney, Agent, or Firm*—Slater & Matsil, L.L.P.

(57) ABSTRACT

Methods of patterning a magnetic stack of a magnetic memory cell and structures thereof. At least the top magnetic material layer of a magnetic stack is patterned using a hard mask, and a conformal insulating material is deposited over the patterned top magnetic material layer and hard mask. The conformal insulating material is anisotropically etched to remove the conformal insulating material over vertical sidewalls of at least the patterned top magnetic material layer and the hard mask. The remaining conformal insulating material comprises a sidewall spacer hard mask that is used as a mask to pattern the remaining material layers of the magnetic stack. The sidewall spacer hard mask may be left remaining in the magnetic memory cell structure.

37 Claims, 6 Drawing Sheets

METHODS OF PATTERNING A MAGNETIC STACK OF A MAGNETIC MEMORY CELL AND STRUCTURES THEREOF

CROSS-REFERENCE TO RELATED APPLICATIONS

The claimed invention was made as a result of activities undertaken within the scope of a joint research agreement between Infineon Technologies AG and International Business Machines Corporation.

This application relates to the following and commonly assigned patent application: Ser. No. 10/868,328, filed on Jun. 15, 2004, entitled "Mask Schemes for Patterning Magnetic Tunnel Junctions," which is now U.S. Pat. No. 7,001,783, issued Feb. 21, 2006 and which application is hereby incorporated herein by reference.

TECHNICAL FIELD

The present invention relates generally to the fabrication of semiconductor devices, and more particularly to the fabrication of magnetic memory devices.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A recent development in semiconductor memory devices involves spin electronics, which combines semiconductor technology and magnetics. The spin of electrons, rather than the charge, is used to indicate the binary states of "1" and "0". One such spin electronic device is a magnetic random access memory (MRAM) device which includes conductive lines (wordlines and bitlines) positioned in a different direction, e.g., perpendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

MRAM devices are typically arranged in an array of rows and column and the wordlines and bitlines are activated to access each individual memory cell. In a cross-point MRAM array, current is run through the wordlines and bitlines to select a particular memory cell. In a field effect transistor (FET) array, each MTJ is disposed proximate a FET, and the FET for each MTJ is used to select a particular memory cell in the array. In a FET array, an electrode is typically formed between the MTJ and the FET to make electrical contact between the MTJ and the FET.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be continually powered to "remember" the stored data. Therefore, it is expected that MRAM devices will replace flash memory, DRAM and static random access memory devices (SRAM) devices in electronic applications where a memory device is needed.

Because MRAM devices operate differently than traditional memory devices, they introduce design and manufacturing challenges. For example, the magnetic material layers and other metal layers that form the magnetic memory cells of an MRAM device are difficult to etch and have a high sputter component, resulting in re-deposition of conductive material in undesired locations, which can short out the devices.

SUMMARY OF THE INVENTION

Embodiments of the present invention provide novel methods of patterning magnetic memory cells of a FET MRAM device. Embodiments of the present invention provide methods of patterning MTJ's of magnetic memory devices that prevent the formation of metal fences on the sidewalls of various material layers of the devices by using a sidewall spacer hard mask formed over sidewalls of a first hard mask and top magnetic layers to pattern the underlying material layers of the magnetic stack.

In accordance with a preferred embodiment of the present invention, a method of manufacturing a semiconductor device includes providing a workpiece, depositing a first magnetic layer over the workpiece, depositing a tunnel insulator over the first magnetic layer, and depositing a second magnetic layer over the tunnel insulator. The second magnetic layer, tunnel insulator, and first magnetic layer form a magnetic stack. A hard mask is deposited over the second magnetic layer, and the hard mask is patterned, the patterned hard mask comprising first sidewalls. At least the second magnetic layer is patterned using the hard mask as a mask, the patterned second magnetic layer comprising second sidewalls. A conformal hard mask material is deposited over the patterned hard mask, at least the patterned second magnetic layer, and the unpatterned layers of the magnetic stack. The conformal hard mask material is anisotropically etched, removing the conformal hard mask material from a top surface of the hard mask and from a top surface of the unpatterned layers of the magnetic stack, leaving portions of the conformal hard mask material at least over the first sidewalls of the hard mask and over the second sidewalls of the patterned second material layer. The remaining conformal hard mask material comprises a sidewall spacer hard mask having downwardly sloping sidewalls. The unpatterned layers of the magnetic stack are then patterned using the sidewall spacer hard mask as a mask.

In accordance with another preferred embodiment of the present invention, a magnetic memory device includes a workpiece, a first magnetic layer disposed over the workpiece, a tunnel insulator disposed over the first magnetic layer, and a second magnetic layer disposed over the tunnel insulator. A hard mask is disposed over the second magnetic layer, the hard mask and at least the second magnetic layer comprising a first pattern and having sidewalls. A sidewall spacer hard mask is disposed over the sidewalls of at least the hard mask and the second magnetic layer, the sidewall spacer hard mask comprising downwardly sloping sidewalls and having a second pattern. The first magnetic layer, the tunnel insulator and the second magnetic layer comprise at least one MTJ.

Advantages of preferred embodiments of the present invention include providing methods of patterning MTJ's of MRAM devices, and structures thereof, that prevent shorting between the MTJ's and the conductive lines used to access the MTJ's, resulting in reduced device failures and improved yields. Few or no additional masks are required, and in one embodiment, the number of mask levels can be reduced. Because an anisotropic etch is used to form the sidewall spacers that are used as a second hard mask, no spacer material resides on the top surface of the hard mask over the second magnetic layer, and no mask is required to form the novel sidewall spacer hard mask. This is advantageous because after the sidewall spacer hard mask formation, the device can be electrically tested in the middle of the manufacturing process, by contacting the first hard mask formed over the MTJ top electrode (or second magnetic material layer), which is conductive. Embodiments of the present invention provide the ability to manufacture MTJ's having a smaller cell size, which results in the ability to place the MTJ's closer together, resulting either in a smaller memory array, or in the ability to put more cells in the same square unit of chip area.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. Embodiments of the present invention may also be applied, however, to other magnetic memory cell designs and magnetic semiconductor device applications. Only one MTJ is shown in each of the figures. However, a plurality of MTJ's may be simultaneously formed using the manufacturing processes described herein. For example, an array of MTJ's may be patterned using embodiments of the present invention. The present invention is particularly beneficial when implemented in the manufacture of FET MRAM arrays, for example.

Figure 1:
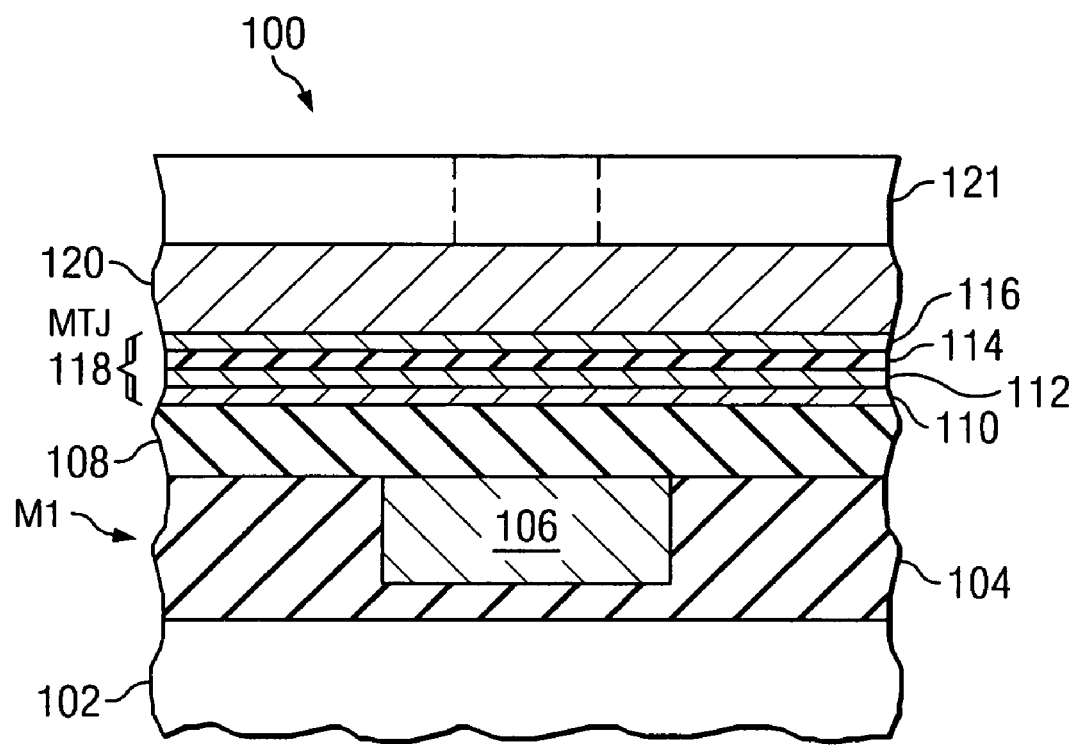
FIGS. 1 through 5 show cross-sectional views of an MRAM device in various stages using a less-preferred manufacturing method, wherein metallic fences form on the sidewalls of the hard mask used to pattern the bottom magnetic material layers, causing shorts to conductive lines in upper metallization layers.

FIGS. 1 through 5 show cross-sectional views of an MRAM device 100 at various stages of manufacturing using a less-preferred method. Referring first to FIG. 1, a first insulating layer 104 is formed over a semiconductor workpiece 102, and first conductive lines 106 are formed within the first insulating layer 104. The first conductive lines 106 may comprise a metal such as copper, aluminum, other metals, or alloys thereof, formed in a first metallization layer M1 of the device 100, for example. The workpiece 102 may include component regions or various circuit elements formed therein (not shown), including a FET transistor for each MTJ, for example. The first conductive lines 106 may be formed in a damascene process or a subtractive etch process, for example. The first conductive lines 106 may include a liner and/or seed layer, for example, not shown. A second insulating layer 108 is formed over the first insulating layer 104 and first conductive lines 106. Conductive vias (not shown) may be formed in the second insulating layer 108 to make electrical contact to FETs in the workpiece 102, for example.

A magnetic stack 118 from which MTJ's 123 (see FIGS. 4 and 5) will be formed is deposited over the second insulating layer 108. The magnetic stack 118 includes an antiferromagnetic layer 110 comprising PtMn or IrMn, for example, disposed over the second insulating layer 108. The antiferromagnetic layer 110 may include a bottom layer of Ta and/or TaN, as examples, because PtMn is incompatible with conventional semiconductor materials; and an encapsulating layer of Ta/TaN may be used over the second insulating layer 108. A first magnetic layer 112 deposited over the antiferromagnetic layer 110, and a tunnel insulator 114 is formed over the first magnetic layer 112. A second magnetic layer 116 is deposited over the tunnel insulator 114. The first magnetic layer 112 and the second magnetic layer 116 each typically comprise one or more layers of magnetic materials and/or metal materials, for example. The magnetic stack 118 may include a seed layer of Ta and/or TaN disposed beneath the antiferromagnetic layer 110. The first magnetic layer 112 and the second magnetic layer 116 may comprise one or more magnetic material layers comprising CoFe, NiFe, CoFeB or other magnetic materials, as examples, although alternatively, the first magnetic layer 112 and the second magnetic layer 116 may comprise other materials. The second magnetic layer 116 may include a cap comprising about 100 Angstroms of Ta or TaN, for example. The tunnel insulator 114 may comprise about 10 to 15 Angstroms or less of an insulator such as $AlO_x$, for example, although alternatively, other insulating materials may be used for the tunnel insulator.

Figure 2:
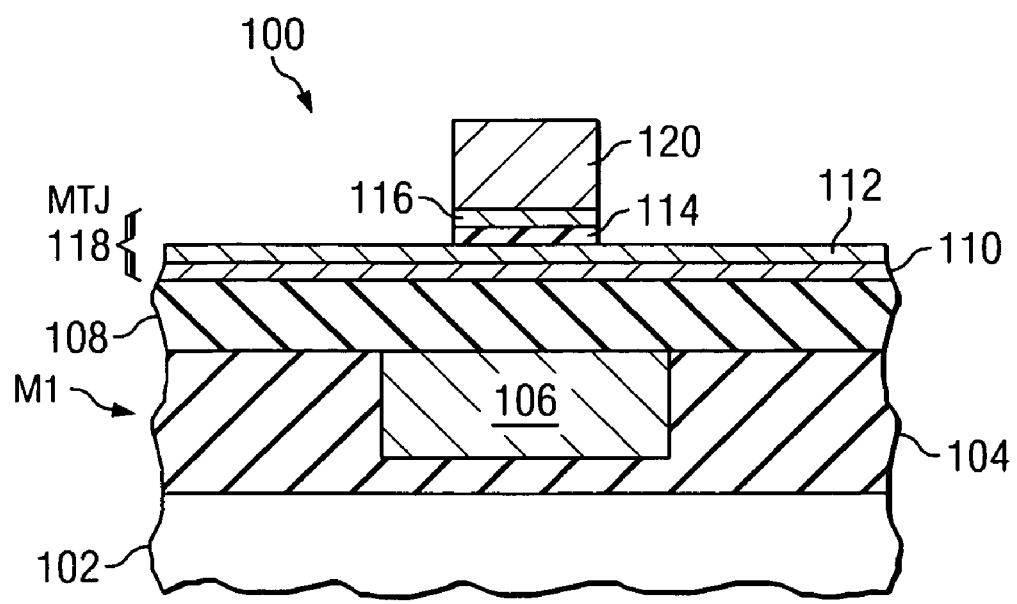

To pattern the magnetic stack 118 layers, a first hard mask 120 is deposited over the second magnetic layer 116. The first hard mask 120 typically comprises about 1500 Angstroms of a conductive material such as titanium nitride (TiN), as an example. The first hard mask 120 is patterned using traditional lithography techniques, e.g., by depositing a first layer of photoresist 121, as shown, patterning the photoresist 121, and using the photoresist as a mask to pattern the first hard mask 120. The photoresist 121 is then removed, and the second magnetic layer 116 and the tunnel insulator 114 are patterned by etching exposed portions of the second magnetic layer 116 and the tunnel insulator 114 using the first hard mask 120 as a mask, as shown in FIG. 2.

The patterned second magnetic layer 116 is often referred to in the art as the free layer 116 of the MTJ 123, because its magnetic polarization may be switched for the desired logic state of the MTJ 123 cell. The free layer 116 may comprise a Stoner-Wohlfarth free layer comprised of a single layer of magnetic film such as NiFe or CoFe having a thickness of about 30 Angstroms that is parallel or anti-parallel magnetically to the first magnetic layer 112, or alternatively, the free layer 116 may comprise a rotational or anti-parallel free layer 116 comprising two magnetic material layers such as NiFe or CoFe having a thickness of about 30 Angstroms sandwiching a nonmagnetic spacer material such as ruthenium, rhenium or osmium having a thickness of about 50 to 60 Angstroms, for example.

Note that after the patterning of the free layer 116, the tunnel insulator 114 may be partially or completely patterned. Alternatively, a portion of (and in a less preferred embodiment, all) the PtMn antiferromagnetic layer 110 may alternatively be patterned during the patterning of the free layer 116.

Figure 3:
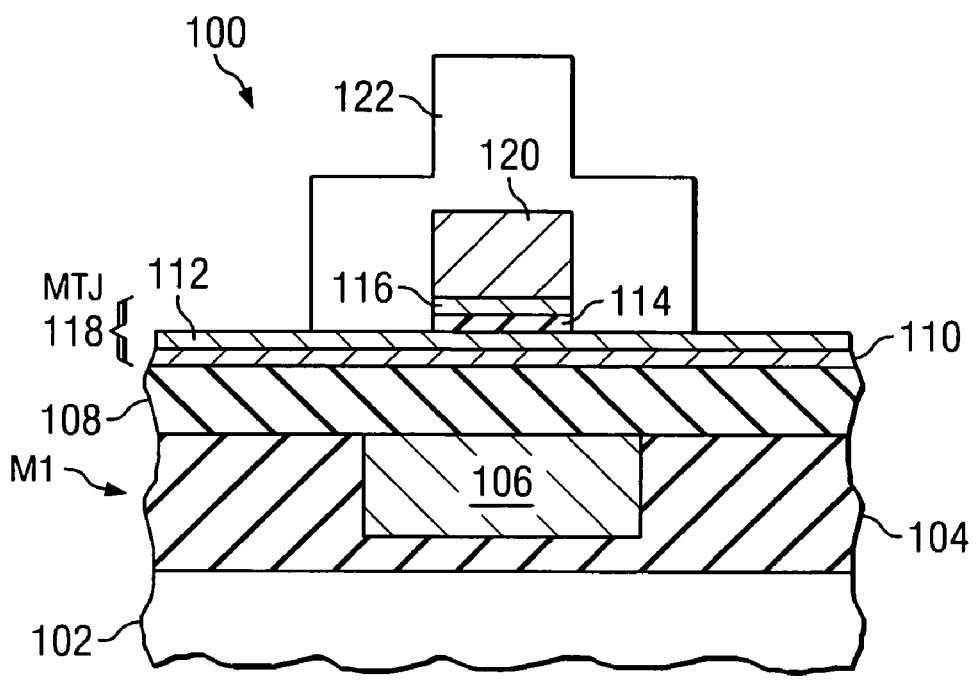

The lower portion of the stack 118 that remains after the free layer 116 patterning is patterned using a second hard mask that is deposited over the workpiece, as shown in FIG. 3. The second hard mask 122 may comprise about 1500 Angstroms of silicon dioxide, for example. The second hard mask 122 is conformal and generally takes the same topography shape as the underlying first hard mask 120, second magnetic layer 116, and tunnel insulator 114, as shown. The second hard mask 122 may have regions comprising substantially vertical sidewalls that extend at about 90° angle from a planar horizontal top surface of the first magnetic layer 112, as shown. The lower or first magnetic layer 112 and the antiferromagnetic layer 110 of the magnetic stack 118 are patterned using the second hard mask 122 as a mask, as shown in FIG. 4, forming the MTJ 123.

The patterned first magnetic layer 112 is often referred to in the art as the pinned layer 112 because its magnetic orientation is fixed or pinned by the antiferromagnetic layer 110. The pinned layer 112 may comprise a simple pinned layer, comprising a single layer of magnetic material such as NiFe or CoFe having a thickness of about 30 Angstroms, or alternatively, the pinned layer 112 may comprise two magnetic material layers such as NiFe or CoFe having a thickness of about 30 Angstroms each, that sandwich a non-magnetic spacer material such as Ru having a thickness of about 10 Angstroms. The non-magnetic spacer material anti-couples the two magnetic layers of the pinned layer 112. The antiferromagnetic layer 110 is often referred to in the art as the pinning layer 110. To store information in the MTJ 123, magnetic orientation of the free layer 116 is set to be either parallel or anti-parallel, causing a change in the resistance of the MTJ 123.

Figure 4:
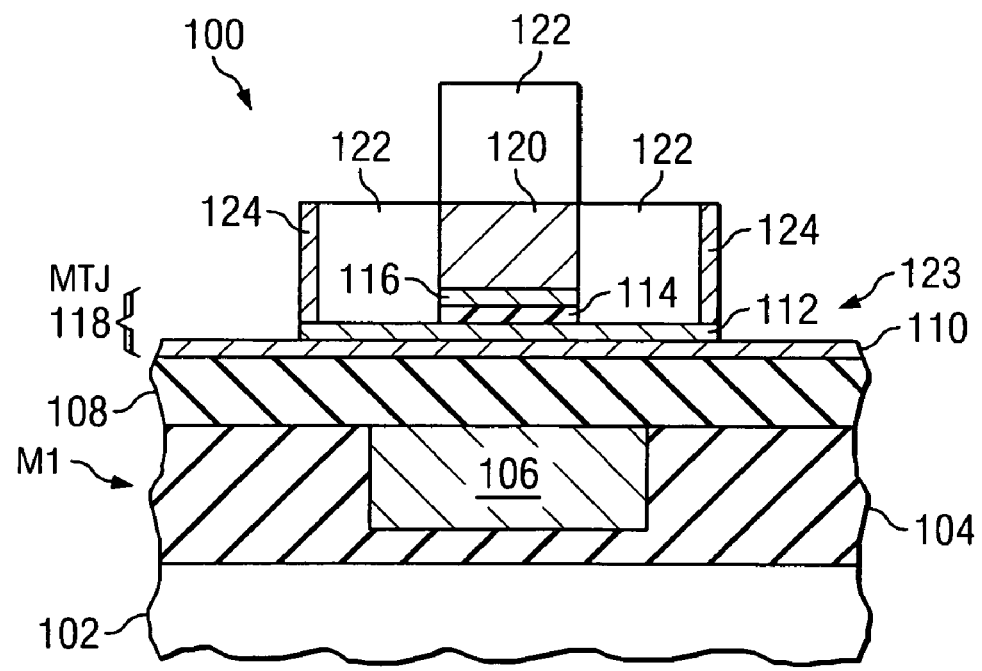

A problem in this less-preferred method of patterning an MTJ 123 is that as the first magnetic layer 112 and the antiferromagnetic layer 110 are patterned or etched, a portion of the magnetic material 112 or other metals in the first magnetic layer 112 and antiferromagnetic layer 110 may be deposited or formed on the sidewalls of the second hard mask 122, forming metal fences 124, as shown in FIG. 4. PtMn and Ta both are difficult to etch and have a tendency to redeposit during etching, especially on sidewalls of features that are substantially vertical, e.g., that have an angle of around 90° with respect to a horizontal surface of the workpiece 102. For example, a sputter etch process involves physically bombarding a material surface to remove material. Often during a sputter process, portions of the material are removed simultaneously while other portions of material are deposited, with a net result of removal of material being the goal. In particular, a reactive ion etch (RIE) process is one type of etching method that may be used to etch the first magnetic layer 112 and the antiferromagnetic layer 110. The RIE process for PtMn has a high sputter component, which causes the creation of the metal fences 124 on the sidewalls of the second hard mask 122. This drawback could be ameliorated by tapering the profile of the second hard mask, but at the expense of inflating the MTJ 123 cell size, e.g., by making the device 100 wider.

Figure 5:
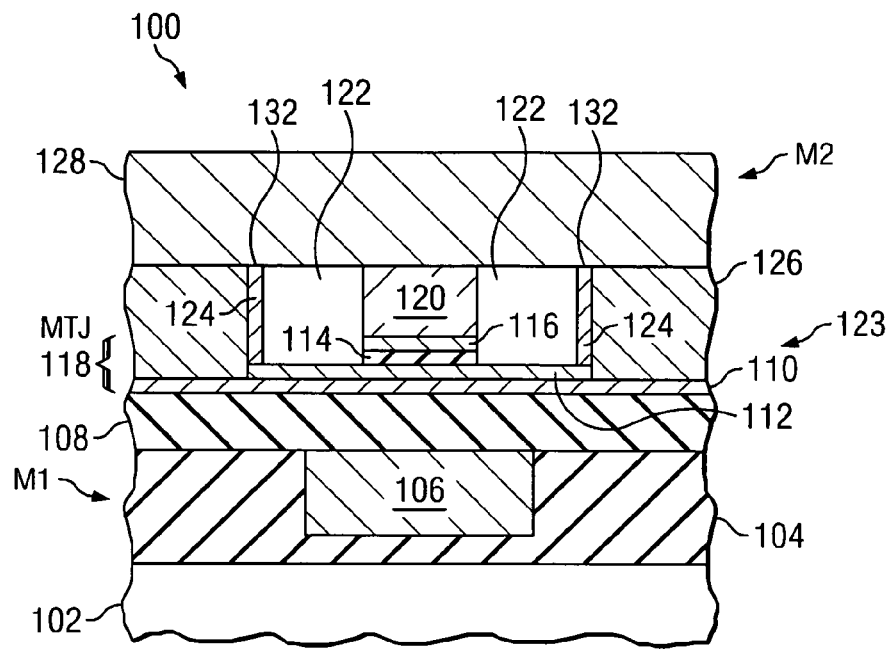

When second conductive lines 128 are formed in subsequent metallization layers such as layer M2 formed in insulating layer 126 as shown in FIG. 5, if metal fences 124 are present in the structure of the semiconductor device 100, shorts will form at 132 where the metal fences 124 abut the conductive liner 128 of the second conductive lines 128. This is problematic because the shorts 132 cause device failures and decreased product yields. The metal fences 124 can render the device 100 inoperable or degrade performance, for example. The fences 124 create a parasitic short mechanism for current to flow from the second conductive lines 128 to the fences 124, to the antiferromagnetic layer 110 rather than tunneling through the tunneling barrier or tunnel insulator 114, destroying or reducing the magnetoresistance of the device 100.

Therefore, what is needed in the art is a method of patterning MTJ's of MRAM devices that does not lead to shorting between the MTJ's and the upper metallization or conductive layers of the MRAM device.

Figure 6:
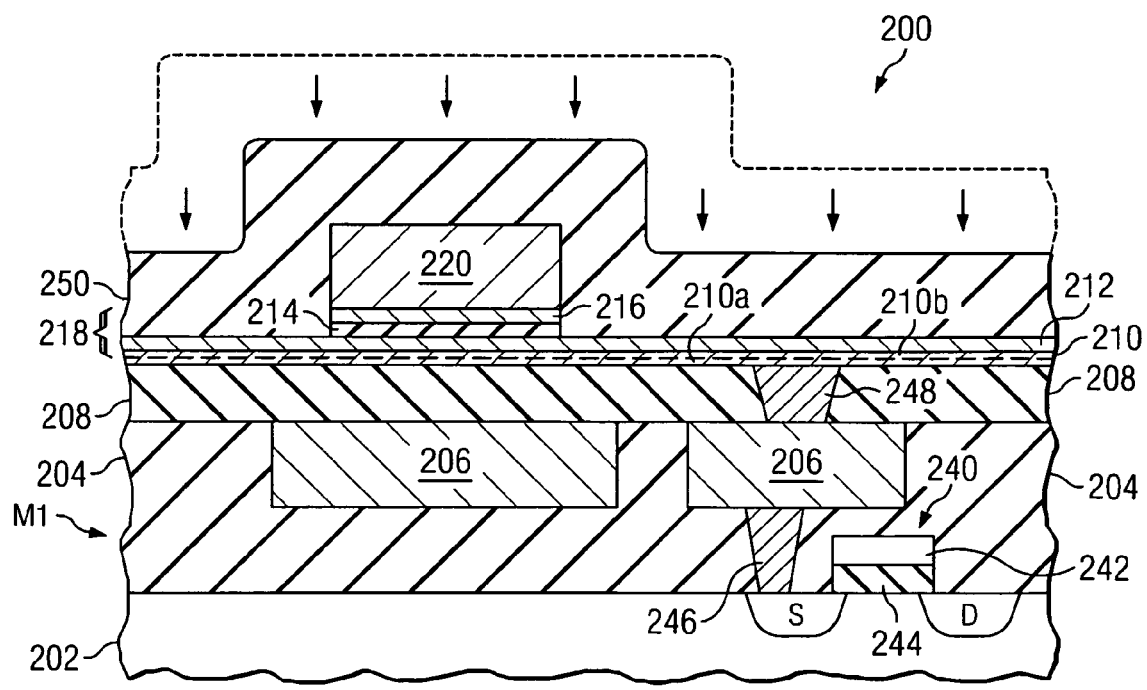
FIGS. 6 through 8 show cross-sectional views of a first embodiment of the present invention of an MRAM device at various stages of manufacturing in accordance with an embodiment of the present invention, wherein a conformal dielectric material is deposited over a patterned free layer and hard mask, and the conformal dielectric material is anisotropically etched to form a sidewall spacer hard mask over at least the sidewalls of the free layer and the hard mask disposed over the free layer.
Figure 7:
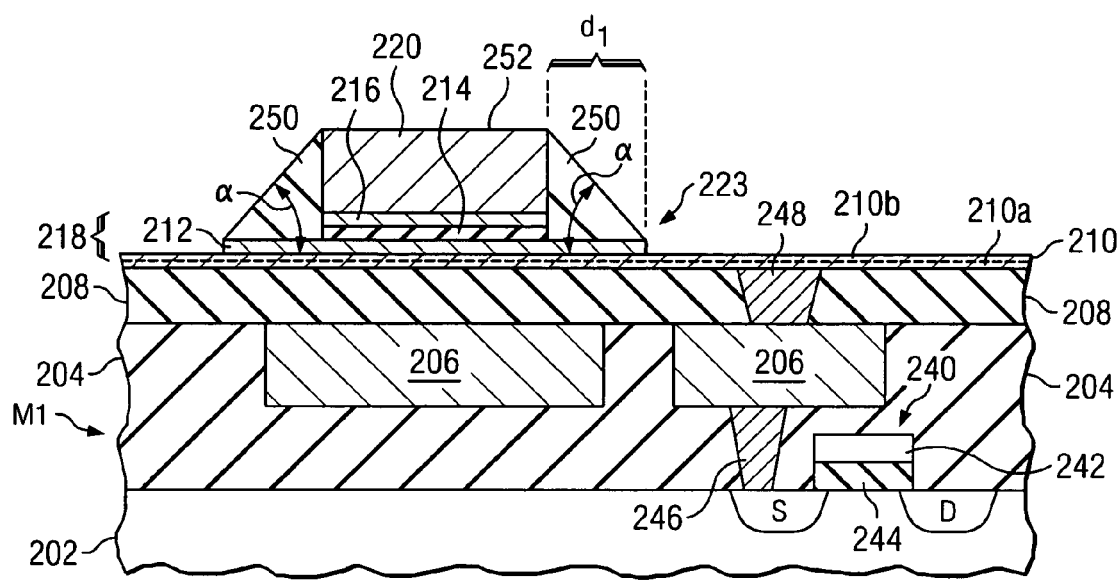
Figure 8:
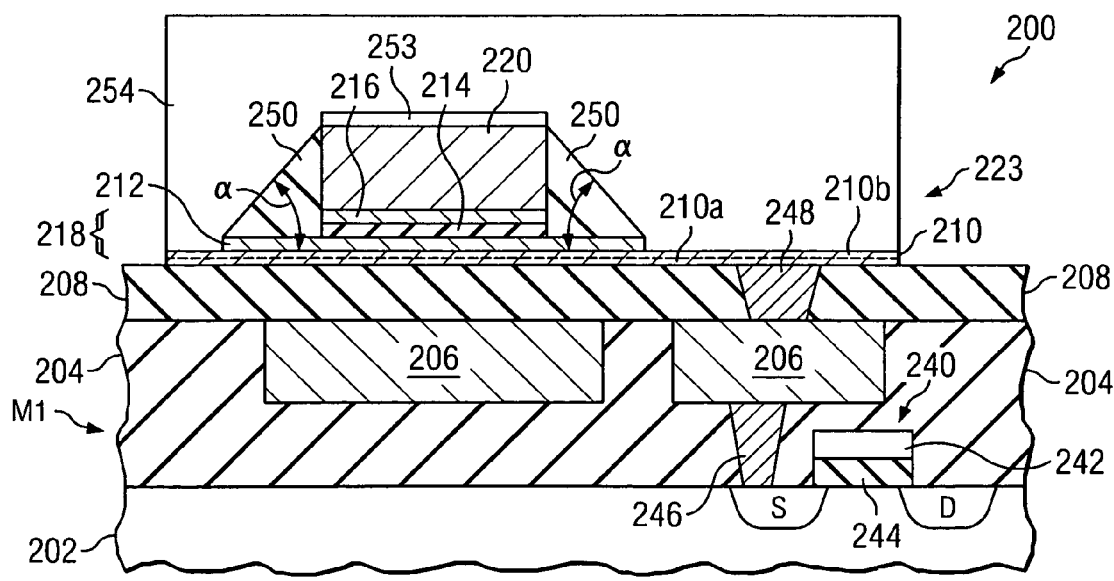

A cross-sectional view of an MRAM device 200 at various stages of manufacturing in accordance with a first preferred embodiment of the present invention is shown in FIGS. 6 through 8. Like numerals are used for the various elements in FIGS. 6 through 8 as were described with reference to FIGS. 1 through 5. To avoid repetition, each reference number shown in the diagram may not necessarily be described again in detail herein. Rather, similar materials x02, x04, x06, x08, etc. . . . are preferably used for the material layers shown as were described for FIGS. 1 through 5, where x=1 in FIGS. 1 through 5 and x=2 in FIGS. 6 through 8. As an example, the preferred and alternative materials and dimensions described for first magnetic layer 112 in the description for FIGS. 1 through 5 are preferably also used for the first magnetic layer 212 in FIGS. 6 through 8.

Referring first to FIG. 6, a workpiece 202 is provided. The workpiece 202 may include a semiconductor substrate comprising silicon or other semiconductor materials covered by an insulating layer, for example. The workpiece 202 may also include other active components or circuits formed in a front end of line (FEOL), not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon. For example, the workpiece 202 may include component regions or various circuit elements formed therein, such as FET 240 which comprises a source S, drain D, gate oxide 244 and a gate 242 which may comprise a read wordline of the MRAM device 200, for example. One or more vias 246 may be formed in the insulating layers 204 of the device 200 to provide electrical connection between layers, for example.

A first insulating layer 204 is deposited over the workpiece 202. The first insulating layer 204 preferably comprises silicon dioxide and may alternatively comprise low dielectric constant materials or other insulating materials, as examples. The first insulating layer 204 may alternatively comprise other materials, for example.

A plurality of first conductive lines 206 are formed within the first insulating layer 204. The first conductive lines 206 may comprise a conductive liner, and a conductive material disposed over and filling the line, for example, not shown. Alternatively, the first conductive lines 206 may comprise a single material, or two or more materials, for example. The conductive line 206 material may comprise copper, aluminum, or combinations thereof, as examples, although alternatively, the conductive material 206 may comprise other conductive materials. The first conductive lines 206 may be formed in a damascene process, for example. Alternatively, the first conductive lines 206 may be formed using a subtractive etch process, for example.

A second insulating layer 208 is deposited over the first insulating layer 204 and conductive lines 206. The second insulating layer 208 may comprise silicon dioxide or other insulators, as examples. The second insulating layer 208 may comprise an inter-level dielectric (ILD) in which vias 248 are formed to make electrical contact to underlying first conductive lines 206.

An antiferromagnetic material layer 210 is deposited over the second insulating layer 208, as shown in FIG. 6. The antiferromagnetic material layer 210 comprises a first layer 210a of TaN/Ta, which preferably comprises a bilayer of Ta and TaN. About 50 Angstroms of TaN may be deposited over the second insulating layer 210 and via 248, and about 50 Angstroms of Ta may be deposited over the TaN first layer 210a, for example. Alternatively, the first layer 210a of the antiferromagnetic material layer 210 may comprise other materials that are adapted act as a seed for the growth of the second layer 210b, and to protect the second insulating layer 210 and via 248 as a diffusion barrier, from the PtMn in the second layer 210b of the antiferromagnetic material layer 210. The second layer 210b comprising about 200 Angstroms or less of PtMn is deposited over the first layer 210a, although alternatively, the second layer 210b may comprise other antiferromagnetic or manganese-containing materials deposited in other dimensions, for example.

Because the first layer 210a comprises a bottom cap layer for the PtMn second layer 210b, for the purposes of discussion it is referred to herein as part of the antiferromagnetic material layer 210; however, the first layer 210a may alternatively not be considered as part of the antiferromagnetic material layer or the magnetic stack 218, but rather may be referred to as a separate cap layer 210a, for example.

A first magnetic layer 212 is deposited over the second insulating layer 210, also shown in FIG. 6. A tunnel insulator 214 is deposited over the first magnetic layer 212, and a second magnetic layer 216 is deposited over the tunnel insulator 214. The second layer 210b of the antiferromagnetic material layer 210, the first magnetic layer 212, the tunnel insulator 214, and the second magnetic layer 216 form a magnetic material stack 218. The first magnetic layer 212, tunnel insulator 214 and second magnetic layer 216 may comprise the materials described with reference to the first magnetic layer 112, tunnel insulator 114 and second magnetic layer 116 of FIGS. 1-5, for example.

A first hard mask 220 is deposited over the second magnetic layer 216, as is shown and described with reference to FIGS. 1-5. The first hard mask 220 preferably comprises a conductive material such as TiN. Alternatively, the first hard mask 220 may comprise Ta, TaN, other materials, or combinations of TiN, Ta, TaN, and other materials, as examples. The first hard mask 220 preferably comprises a thickness of about 1500 Angstroms, although alternatively, the first hard mask 220 may comprise other dimensions. For example, the first hard mask 220 may comprise a thickness of about 2000 Angstroms or less in one embodiment.

The first hard mask 220 is then patterned with the desired pattern for at least the second magnetic layer 216. For example, the first hard mask 220 may be patterned by depositing an oxide mask (not shown) over the first hard mask 220. A photoresist may then be deposited over the oxide mask, and the photoresist may be patterned with a pattern for at least the second magnetic layer 216. Portions of the photoresist are removed, and the pattern from the photoresist is transferred to the oxide mask. For example, the oxide mask may be etched, and exposed portions of the oxide mask may be removed while portions of oxide mask that are protected by the photoresist remain residing over the first hard mask. The photoresist may be a negative or positive photoresist, for example. The remaining photoresist is then removed.

Next, the pattern is transferred from the oxide mask to the first hard mask 220. Similarly, the first hard mask 220 is etched such that exposed portions of the first hard mask 220 are removed, while portions of the first hard mask 220 protected by the oxide mask remain residing over the second magnetic material 216. The remaining oxide mask is removed from over the first hard mask 220. Alternatively, a photoresist can be used to pattern the first hard mask 220, rather than using an oxide mask to pattern the first hard mask 220, for example.

The patterned first hard mask 220 comprises a first pattern. The first hard mask 220 is then used to pattern at least the second magnetic layer 216, as shown in FIG. 6. Thus, the second magnetic layer 216 also comprises the first pattern. At least a portion of the tunnel insulator 214 may also be patterned with the first pattern, as shown. In other embodiments, at least a portion of, or all of, the first magnetic material 212 is also patterned (not shown; see FIG. 12). In another embodiment, a portion of, but not all of, the second layer 210b of the antiferromagnetic material layer 210 may be removed during the patterning of the second magnetic layer 216 to form the free layer 216 ((not shown in FIG. 6; see FIG. 12).

Referring again to FIG. 6, in particular, preferably, at least the second magnetic layer 216 is patterned using the first hard mask as a mask. For example, the second magnetic material 216 may be exposed to an etch process such as a RIE, and exposed portions of the second magnetic layer 216 and possibly portions of the other layers 214, 212, 210b, as described above, may be removed. The first hard mask 220 and at least the second magnetic layer 216 comprise the first pattern of the first hard mask 220.

The first hard mask 220 is preferably left remaining in the structure 200, rather than removing it. Because the first hard mask 220 is conductive, it may be used to make electrical contact to the top second magnetic layer 216 and thus to the MTJ 223 (see FIG. 5, for example).

In accordance with a preferred embodiment of the present invention, a second hard mask material 250 is next deposited over the patterned first hard mask 220, the patterned second magnetic layer 216, and exposed portions of the underlying unpatterned material layers, as shown in FIG. 6. The second hard mask material 250 preferably comprises an insulating material that is substantially conformal. The second hard mask material 250 preferably comprises the same thickness over all features of the topography of the device 200, for example. The second hard mask material 250 preferably comprises a conformal dielectric material such as $SiO_2$ deposited by plasma enhanced tetra ethyl oxysilane (PE-TEOS), $SiO_2$ deposited by silane ($SiH_4$), SiC, SiCO, SiN, SiCN or combinations thereof, as examples. The second hard mask 250 material may comprise BLoK™ or n-BLoK™ by Applied Materials, as examples. Alternatively, the second hard mask material 250 may comprise high dielectric constant (k) materials, such as $HfO_2$, $HfSiO_x$, $Al_2O_3$, $ZrO_2$, $ZrSiO_x$, $Ta_2O_5$, $La_2O_3$, SiON, combinations thereof, or combinations of one or more high k materials with $SiO_2$, SiC, SiCO, SiN, or SiCN, for example. The second hard mask material 250 may alternatively comprise other materials, for example.

Depositing the second hard mask material 250 preferably comprises depositing a material layer having a thickness of about 2000 Angstroms, e.g., having a thickness of about 3000 Angstroms or less, although alternatively, the second hard mask material 250 may comprise other dimensions, for example. Preferably, the second hard mask material 250 is deposited in a thickness that is at least as thick as the height of the top surface of the first hard mask 220, as shown in phantom.

The second hard mask material 250 is preferably substantially conformal to the underlying topography of the structure 200 in one embodiment, as shown in FIG. 6. In particular, the second hard mask material 250 preferably comprises a top surface having substantially the same topography as the underlying exposed second magnetic layer 216, the tunnel insulator 214, and the sidewalls and top surface of the patterned first hard mask 220. The second hard mask material 250 at this point of the manufacturing process may have a topography including features with sidewalls that are substantially perpendicular to a horizontal surface of the workpiece 202, as shown.

The second hard mask material 250 is then exposed to an anisotropic etch process. Because an anisotropic etch process comprises bombarding horizontal surfaces more strongly than vertical surfaces, preferentially etching the horizontal surfaces, all of the second hard mask material 250 is removed from the horizontal surfaces of the workpiece 202, while the second hard mask material 250 is left remaining over sidewalls of features, as shown in FIG. 7. The second hard mask material 250 forms a sidewall spacer hard mask 250 over the sidewalls of the first hard mask 220 and at least the patterned second magnetic material 216. If portions of the tunnel insulator 214, second magnetic material 212 and PtMn second layer 210b of the antiferromagnetic material layer 210 were patterned during the patterning of the second magnetic material, the sidewall spacer hard mask 250 is also formed over the sidewalls of these material layers.

The anisotropic etch process to form the sidewall spacer hard mask 250 preferably comprises a highly polymerizing chemistry such as cyclical $C_4F_8$ (octofluoro-cyclobutane), $C_2F_6$, $CHF_3$, $C_6F_8$, or $CH_3F$, as examples, although alternatively, the anisotropic etch process may comprise other chemistries. Argon may be included in the etchant gas mixture to function as a buffer. The workpiece 202 is preferably placed on a chuck and an RF voltage bias is applied to the workpiece 202 during the anisotropic etching process. A moderately high RF voltage bias is applied to the workpiece 202. Because a highly polymerizing etchant gas is used, a polymer coats the workpiece 202 everywhere, and as the ions of the etchant gas directionally bombard the workpiece 202 surface in a vertical direction, the polymer formed on sidewalls of the features protects the second hard mask material 250 from being etched.

The sidewall spacer hard mask 250 that is formed preferably comprises downwardly sloping sidewalls, preferably comprising an angle $\alpha$ comprising less than about 85° with respect to a horizontal surface of the workpiece 202. In one embodiment, the angle $\alpha$ comprises an angle of about 30 to 70° with respect to the horizontal surface of the workpiece 202. In another embodiment, the angle $\alpha$ comprises an angle of about 50° with respect to the horizontal surface of the workpiece 202, for example.

The sidewall spacer hard mask 250 preferably is wider at the bottom proximate the second insulating layer 208 than at the top of the sidewall spacer hard mask 250, as shown. The sidewall spacer hard mask 250 preferably comprise a width $d_1$ at the bottom thereof, as shown, wherein the width $d_1$ comprises about 90 nm, as an example, although alternatively, the width $d_1$ may comprise other dimensions, such as about 120 nm or less, for example.

Advantageously, no mask level is required to form the novel sidewall spacer hard mask 250 of embodiments of the present invention. Rather, the anisotropic etch process automatically forms the desired shape and second pattern of the sidewall spacer hard mask 250.

The sidewall spacer hard mask 250 is used as a mask while the exposed material layers, such as tunnel insulator 214 (not shown in FIG. 7; see FIG. 12), first magnetic material 212, and the second layer 210b comprising PtMn of the antiferromagnetic material layer 210 are patterned using an etch process, forming at least one MTJ 223, as shown in FIG. 7. For example, an etch chemistry that is adapted to selectively sputter PtMn but not attack the sidewall spacer hard mask 250 of the TiN first hard mask 220 is preferably used. For example, the same material in the gas phase that the sidewall spacer hard mask 250 comprises may be used as an etch chemistry: e.g., if the sidewall spacer hard mask 250 comprise SiN, a nitrogen plasma etch chemistry may be used; or, if the sidewall spacer hard mask 250 comprise oxygen, argon oxygen, oxygen nitrogen, or other etch chemistries may be used to etch the exposed material layers 210a, 212, or 214. Preferably, the first layer 210a is not etched during the etching of at least the second layer 210b of the antiferromagnetic material layer 210 in this embodiment, as shown in FIG. 7. However, alternatively, the first layer 210a may alternatively be etched with the second pattern of the sidewall spacer hard mask 250, which is shown in the embodiments illustrated in FIGS. 10, 11 and 12.

Advantageously, because no substantial 90 degree angles exist on the sidewalls of the sidewall spacer hard mask 250, no metal fences form while the exposed material layers 210a, 212, or 214 are etched using the sidewall spacer hard mask 250 as a mask. Thus, shorts to subsequently formed metallization layers are prevented by embodiments of the present invention.

Note that because the sidewall spacer hard mask 250 comprises a lower width $d_1$, the second pattern of the material layers 210b, 212, or 214 that are patterned using the sidewall spacer hard mask 250 comprise a larger footprint, e.g., are wider in at least one direction horizontally across the workpiece 202, than the first pattern for the second magnetic layer 216 and in the embodiment shown, also the tunnel insulator layer 214, in this embodiment. The term "footprint" as used herein refers to a horizontal feature size of a device formed over the workpiece.

In particular, in the embodiment shown in FIG. 7, the sidewall spacer hard mask 250, the first magnetic layer 212 and the PtMn layer 210b comprise a second pattern, wherein the second pattern has a larger footprint than the first pattern. For example, as can be seen in FIG. 7, the first magnetic layer 212 and layer 210b have a horizontal width that is greater than the horizontal width of the tunnel insulator 214 and second magnetic layer 216. In a view rotated about 90 degrees from the view shown, the first pattern of the tunnel insulator 214 and second magnetic layer 216 may have the same, or a different, horizontal width than the second pattern of the first magnetic layer 212, for example (not shown in FIG. 7; see the top view in FIG. 9).

The MTJ 223 comprises the patterned magnetic layers 212 and 216 and tunnel insulator 214. In the patterning process for the MTJ 223 described herein, exposed portions of the first magnetic layer 212 are etched away, using a wet etch chemistry or a RIE, as examples, although alternatively, other etch chemistries and processes may be used to etch away or remove portions of the first magnetic layer 212 and also portions of the second layer 210b of the antiferromagnetic material layer 210. Portions of the first magnetic layer 212 and second layer 210b are protected from the etch process by the second hard mask 250.

Preferably, in the embodiment shown, the first layer 210a of the antiferromagnetic material layer 210 is not etched during the etch process of the PtMn second layer 210b and first magnetic material 212. Rather, in this embodiment, the first layer 210a will be used as a conductive strap to electrically connect the MTJ first magnetic material 212 with via 248 and the underlying FET 240. The first layer 210a of the antiferromagnetic material layer 210 is preferably patterned using a separate lithography process. For example, a photoresist 254 may be deposited over the MTJ 223 and exposed portions of the first layer 210a of the antiferromagnetic material layer 210, as shown in FIG. 8. The photoresist 254 is patterned with the desired pattern for the conductive strap, and the photoresist 254 is used as a mask while portions of the first layer 210a of the antiferromagnetic material layer 210 are etched away. The photoresist 254 is then stripped away, and the manufacturing process for the MRAM device 200 is continued. Alternatively, a hard mask may be deposited and patterned, and may be used to pattern the first layer 210a of the antiferromagnetic material layer 210, not shown.

Advantageously, because the first layer 210a of the antiferromagnetic material layer 210 is etched in a separate photolithography step in this embodiment, no conductive fences can form on sidewalls of the antiferromagnetic material layer, preventing a short to the underlying conductive lines 206, for example.

During the patterning of the second layer 210a of the antiferromagnetic material layer 210 and/or first magnetic material 212, advantageously, the first hard mask 220 is not etched or removed during the etch process. Rather, a thin crust of oxide or nitride 252 a few monolayers thick forms on the top surface, protecting the first hard mask 220. This thin insulating crust 252 may be easily scratched away, providing electrical contact and thus providing the ability to perform electrical tests on the MRAM device 200 during the manufacturing process. Prior art processes do not provide this advantage because the first hard mask 120 is encapsulated with a second hard mask 122 until the second hard mask 122 is removed to form the second conductive lines 128 over the first hard mask 120, as shown in FIG. 4. The ability to test the device 200 of embodiments of the present invention at various stages of manufacturing is quite advantageous, because if something has gone wrong in the manufacturing process, it is detectable, and further processing of the workpiece 202 can be discontinued, saving time and money.

Second conductive lines (not shown in FIG. 8; refer to FIG. 5) may be formed using a damascene process. For example, a third insulating layer (also not shown) may be deposited, and the second conductive lines which comprise bitlines of the MRAM device 200 may be formed in the third insulating layer. Alternatively, the second conductive lines may be formed using a subtractive process, for example.

Figure 9:
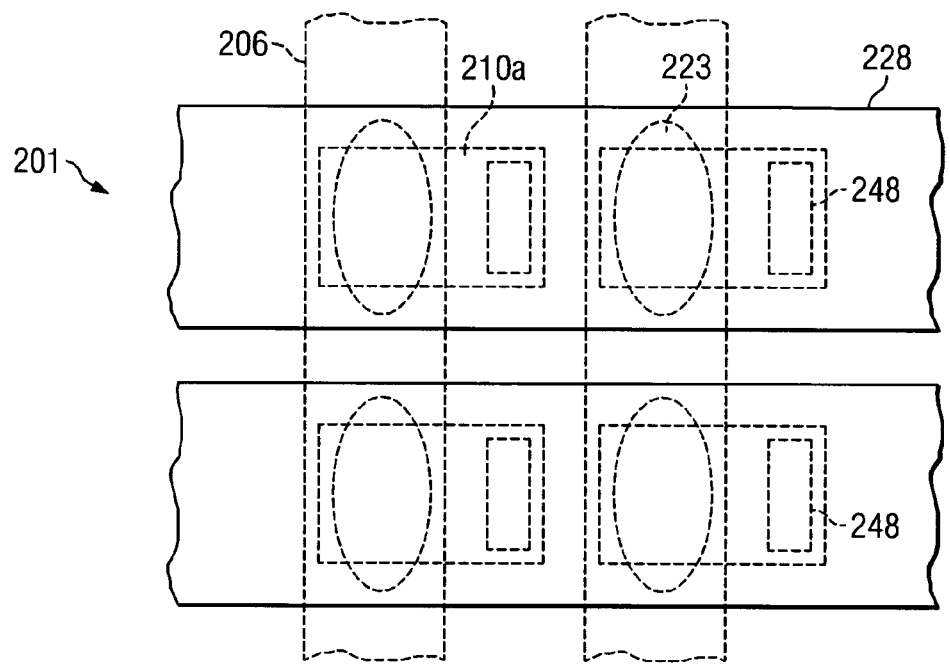
FIG. 9 shows a top view of an MRAM array manufactured in accordance with the method described for FIGS. 6 through 8.

FIG. 9 shows a top view of an MRAM array 201 manufactured in accordance with the method described for FIGS. 6 through 8. Second conductive lines 228 are shown over the MTJ's 223 running in a substantially perpendicular direction to first conductive lines 206. The strap 210a connects the MTJ 223 bottom plate to a via 248 and an underlying first conductive line (not shown in FIG. 9; see FIG. 8). The second conductive lines 228 may comprise bitlines of an MRAM array, and the first conductive lines 206 may comprise wordlines, for example. Alternatively, the converse may be true. For example, the second conductive lines 228 may comprise wordlines of an MRAM array, and the first conductive lines 206 may comprise bitlines. Referring again to FIG. 8, the FET 240, bitlines 228 or 206, and wordlines 206 or 228 may be used to select a particular MRAM memory cell 223, for example, in an FET MRAM array application.

Figure 10:
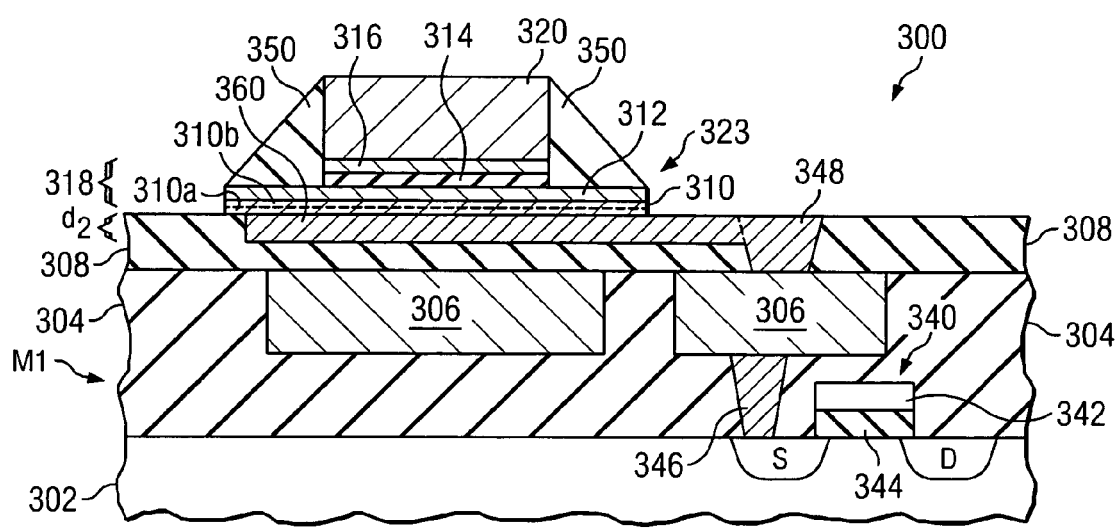
FIG. 10 shows an embodiment of the present invention, wherein the strap coupling the MTJ to an underlying wordline is formed before the MTJ material stack is deposited.
Figure 11:
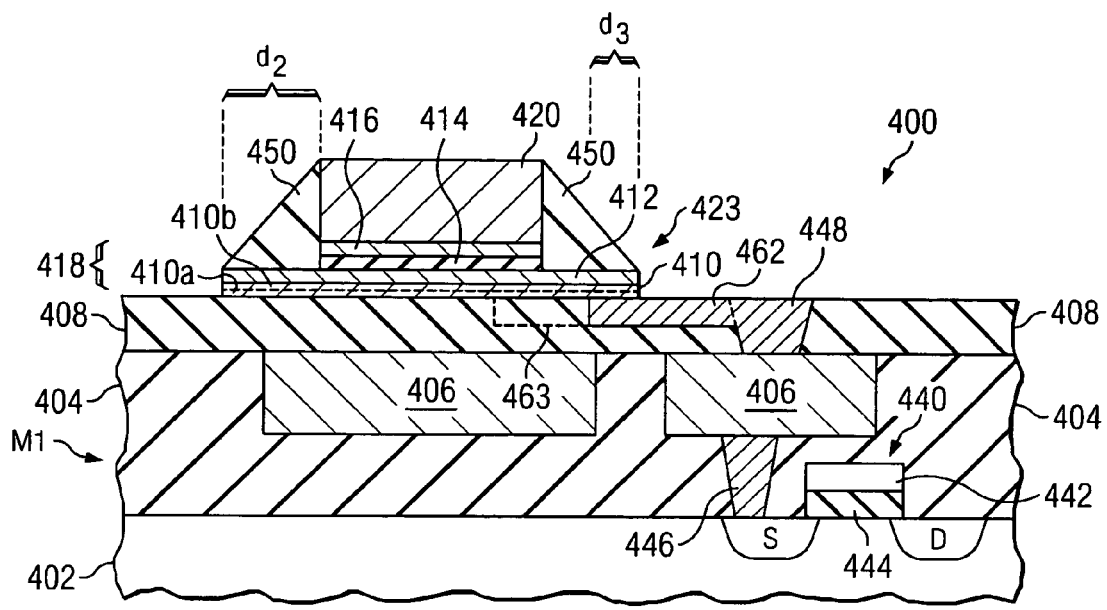
FIG. 11 shows another embodiment of the present invention, wherein the strap does not reside under the magnetic materials of the MTJ, but rather, underlies a portion of the sidewall spacer, not affecting the surface roughness under the MTJ and Neel coupling.
Figure 12:
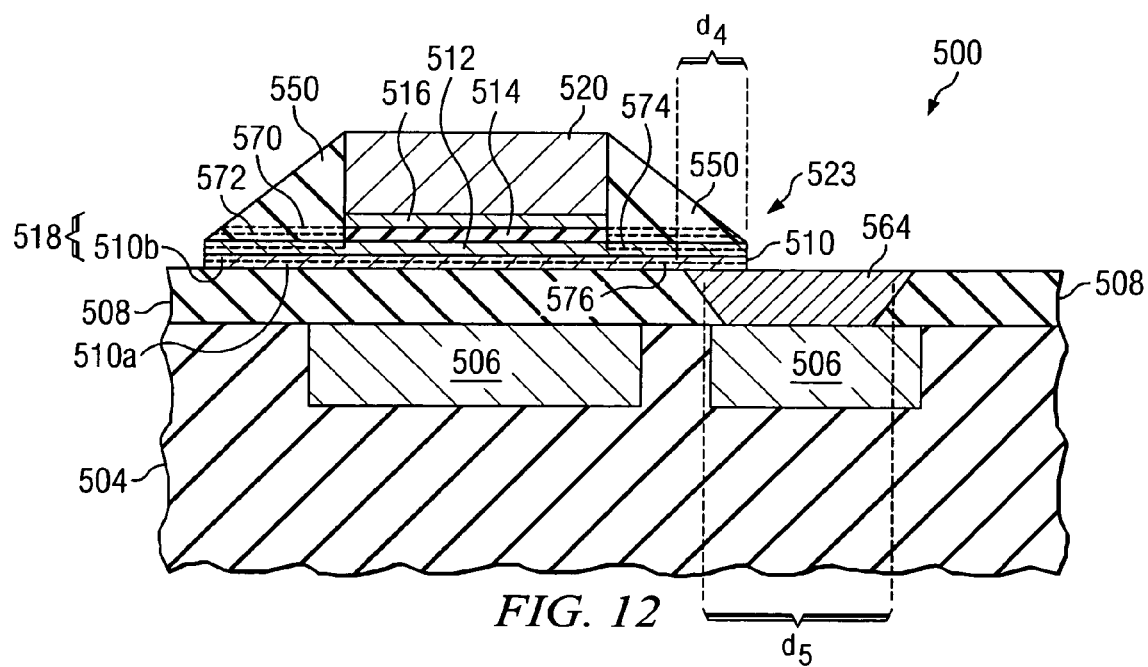
FIG. 12 shows an embodiment of the present invention wherein the strap coupling the MTJ to an underlying wordline comprises a wide via.

FIGS. 10, 11 and 12 show additional embodiments of the present invention. Again, like numerals have been used for the various elements in FIGS. 10, 11 and 12 as were described with reference to FIGS. 1-5 and 6-9. To avoid repetition, each reference number shown in the figures may not necessarily be described again in detail herein. Rather, similar materials x02, x04, x06, x08, etc. . . . are preferably used for the material layers shown as were described for FIGS. 1-5 and 6-9, where x=1 in FIGS. 1 through 5, x=2 in FIGS. 6 through 8, x=3 in FIG. 10, x=4 in FIG. 11, and x=5 in FIG. 12.

FIG. 10 shows an embodiment of the present invention, wherein the strap 360 coupling the MTJ 323 to an underlying wordline 306 is formed before the MTJ material stack 318 is deposited. The strap 360 may be formed in a damascene process or in a subtractive etch process. The strap 360 comprises a conductive material such as a metal, for example, formed in insulating layer 308. The strap 360 and via 348 may be formed in a dual damascene process within the insulating layer 308, for example. The via 348 is disposed directly above the wordline 306 and electrically couples the wordline to the strap 360, which in this embodiment resides beneath the MTJ 323, as shown. The strap 360 may comprise a thickness $d_2$ of about 500 Angstroms, for example, although the thickness $d_2$ may alternatively comprise other dimensions. Advantageously, the strap 360 may be formed thicker than the strap 210a of FIG. 8, for example.

In the embodiment of FIG. 10, an additional mask is required to pattern the strap 360. However, in this embodiment, the first layer 310a of the antiferromagnetic layer 310 is preferably patterned with the second pattern of the sidewall spacer hard mask 350, as shown, which eliminates one mask level (e.g., the mask that was used to pattern the strap 210a in the embodiment shown FIG. 8). Therefore, this embodiment is advantageous in that no additional masks levels are required.

FIG. 11 shows another embodiment of the present invention, wherein the strap 462 is formed in an underlying insulating layer 408, as in the embodiment shown in FIG. 10. However, in this embodiment, the conductive strap 462 does not reside under the magnetic materials of the MTJ 423, but rather, underlies a portion of the sidewall spacer hard mask 450, by a distance $d_3$ as shown. The distance $d_3$ may comprise about ½ of the width $d_2$ of the sidewall spacer hard mask 450, for example, although alternatively, the distance $d_3$ may comprise other dimensions, for example. In one embodiment, a portion of the strap 462 may reside under a portion of the MTJ, as shown in phantom at 463, for example. Reducing the amount that the strap 462 resides under the MTJ 423 (or eliminating it) reducing the Neel coupling for the MTJ 423, resulting in improved device 400 performance. As with the embodiment shown in FIG. 10, the embodiment shown in FIG. 11 is advantageous in that an additional mask level is not required.

FIG. 12 shows an embodiment of the present invention, wherein the strap coupling the MTJ to an underlying wordline 506 comprises a wide via 564 rather than a separately formed strap. This embodiment is advantageous because a mask level may be eliminated. For example, the existing mask used to form via 448 shown in FIG. 11 may be modified so that a wide via 564 is formed. The wide via 564 preferably has a width large enough so that a portion $d_4$ underlies a portion of the first layer 510a of the antiferromagnetic layer 510, as shown. The distance $d_4$ that the wide via 564 extends beneath the antiferromagnetic layer 510 may comprise about 700 Angstroms, for example. The width $d_5$ of the wide via 564 may comprise about 3000 Angstroms, for example. Alternatively, dimensions $d_4$ and $d_5$ may comprise other widths, for example. This embodiment is also advantageous because it reduces Neel coupling, by avoiding adding an additional material layer beneath the MTJ 523 that may induce Neel coupling.

Depending on the etch processes used and where the etch processes stop, the various material layers 510a, 512, 514 and 516 or portions thereof may comprise either the first pattern of the first hard mask 520 or the second pattern of the sidewall spacer hard mask 550, which is illustrated in FIG. 12. In one embodiment, none of the tunnel insulator 514 is patterned with the first pattern (see FIG. 12 at 570). In this embodiment, all (570) or a portion of (572) the tunnel insulator 514 is patterned with the second pattern of sidewall spacer hard mask 550. Likewise, when the first hard mask 520 is used as a mask to etch the magnetic stack 518, all or a portion of (574) the first magnetic layer 512 may be patterned with the first pattern of the first hard mask. Alternatively, all or a part of the first magnetic layer 512 may be patterned with the second pattern of sidewall spacer hard mask 550. A portion of (576) the second layer 510b of the antiferromagnetic layer 510 may be patterned with the first pattern of the first hard mask 550, or alternatively, the second layer 510b, or both the first layer 510a and the second layer 510b of the antiferromagnetic layer 510 may be patterned with the second pattern of sidewall spacer hard mask 550.

Advantages of embodiments of the present invention include providing methods of forming an MTJ or magnetic memory cell 223, 323, 423, 523 wherein shorts are not caused by metal fences 124 (see FIG. 5) that may form on the sidewalls of the hard mask 122 used to pattern lower magnetic material layers during the etching process used to pattern the lower magnetic material layers. Because the sidewall spacer hard mask 250, 350, 450, 550 may have an angle of about 85° or less with respect to a horizontal surface of the workpiece 202, 302, 402, 502, fences cannot be formed. Thus, the methods of manufacturing and structures for a magnetic memory device 200, 300, 400, 500 described herein prevent shorts, reduce device failures, and improve device yields.

Advantageously, few or no additional masks are required by embodiments of the present invention, and in one embodiment, the number of mask levels can be reduced (e.g., in the embodiment shown in FIG. 12, wherein the strap comprises an oversized via 564). Because an anisotropic etch is used to form the sidewall spacer hard mask 250, 350, 450, 550, none of the sidewall spacer hard mask 250, 350, 450, 550 material resides on the top surface of the first hard mask 220, 320, 420, 520 over the second magnetic layer 216, 316, 416, 516. This is advantageous because after the sidewall spacer hard mask 250, 350, 450, 550 formation, the device can be electrically tested in the middle of the manufacturing process, by contacting the first hard mask 220, 320, 420, 520, which is conductive. Embodiments of the invention provide the ability to manufacture MTJ's 223, 323, 423, 523 having a smaller cell size, which results in the ability to place the MTJ's 223, 323, 423, 523 closer together, resulting either in a smaller array, or in the ability to put more cells 223, 323, 423, 523 in the same square unit of cell space.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that the materials and processes described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece;
   depositing a first magnetic layer over the workpiece;
   depositing a tunnel insulator over the first magnetic layer;
   depositing a second magnetic layer over the tunnel insulator, wherein the second magnetic layer, tunnel insulator, and first magnetic layer form a magnetic stack;
   depositing a hard mask over the second magnetic layer;
   patterning the hard mask, the patterned hard mask comprising first sidewalls;
   patterning at least the second magnetic layer using the hard mask as a mask, the patterned second magnetic layer comprising second sidewalls;
   depositing a conformal hard mask material over the patterned hard mask, at least the patterned second magnetic layer, and unpatterned layers of the magnetic stack;
   anisotropically etching the conformal hard mask material, removing the conformal hard mask material from a top surface of the hard mask and from a top surface of the unpatterned layers of the magnetic stack, leaving portions of the conformal hard mask material at least over the first sidewalls of the hard mask and over the second sidewalls of the patterned second material layer, the remaining conformal hard mask material comprising a sidewall spacer hard mask, the sidewall spacer hard mask comprising downwardly sloping sidewalls; and
   patterning the unpatterned layers of the magnetic stack using the sidewall spacer hard mask as a mask.

2. The method according to claim 1, wherein patterning at least the second magnetic layer and patterning the unpatterned layers of the magnetic stack comprise forming at least one magnetic tunnel junction (MTJ).

3. The method according to claim 1, further comprising:
   forming a plurality of first conductive lines over the workpiece, before depositing the first magnetic layer over the workpiece, the plurality of first conductive lines being isolated from one another by a first insulating layer; and
   depositing an antiferromagnetic layer over the plurality of first conductive lines, wherein the magnetic stack comprises at least a portion of the antiferromagnetic layer, and wherein patterning the unpatterned layers of the magnetic stack using the sidewall spacer hard mask as a mask further comprises patterning at least a portion of the antiferromagnetic layer.

4. The method according to claim 3, wherein depositing the antiferromagnetic layer comprises depositing a first layer and depositing a second layer over the first layer, wherein the first layer comprises a conductive material, wherein the second layer comprises an antiferromagnetic material, and wherein patterning the unpatterned layers of the magnetic stack using the sidewall spacer hard mask as a mask comprises patterning the second layer of the antiferromagnetic layer.

5. The method according to claim 4, wherein depositing the first layer of the antiferromagnetic layer comprises depositing a bilayer of Ta and TaN, and wherein depositing the second layer of the antiferromagnetic layer comprises depositing PtMn.

6. The method according to claim 4, further comprising patterning the first layer of the antiferromagnetic layer to form a conductive strap between a first conductive line and the second layer of the antiferromagnetic layer.

7. The method according to claim 6, wherein patterning the first layer of the antiferromagnetic layer comprises depositing a photoresist, patterning the photoresist, and etching the first layer of the antiferromagnetic layer using the photoresist as a mask.

8. The method according to claim 6, further comprising depositing a second insulating layer over the plurality of first conductive lines and first insulating layer, before depositing the first magnetic layer, and forming at least one via within the second insulating layer, the at least one via being conductive and coupling the conductive strap to the first conductive line.

9. The method according to claim 4, wherein patterning the unpatterned layers of the magnetic stack using the sidewall spacer hard mask as a mask further comprises patterning the first layer of the antiferromagnetic layer.

10. The method according to claim 9, further comprising forming a conductive strap within a second insulating layer over the plurality of first conductive lines and the first insulating layer, before depositing the first magnetic layer, the conductive strap being coupled to the first layer of the antiferromagnetic layer, and further comprising forming at least one conductive via between the conductive strap and one of the first conductive lines.

11. The method according to claim 10, wherein forming the conductive strap comprises forming the conductive strap disposed beneath the patterned magnetic stack.

12. The method according to claim 10, wherein forming the conductive strap comprises forming the conductive strap disposed beneath a portion of the sidewall spacer hard mask.

13. The method according to claim 10, wherein the conductive via comprises the conductive strap, wherein forming the conductive via comprises forming the conductive via disposed beneath a portion of the sidewall spacer hard mask, wherein forming the conductive via comprises coupling the conductive via between the first layer of the antiferromagnetic layer and the first conductive line.

14. The method according to claim 1, wherein depositing the conformal hard mask material comprises depositing about 3000 Angstroms or less of $SiO_2$ deposited by plasma enhanced tetraethoxysilate (PETEOS) or silane ($SiH_4$), SiC, SiCO, SiN, SiCN, $HfO_2$, $HfSiO_x$, $Al_2O_3$, $ZrO_2$, $ZrSiO_x$, $Ta_2O_5$, $La_2O_3$, SiON, or combinations thereof.

15. The method according to claim 1, wherein anisotropically etching the conformal hard mask material comprises using a highly polymerizing chemistry.

16. The method according to claim 15 wherein anisotropically etching the conformal hard mask material comprises a cyclical $C_4F_8$ (octofluoro-cyclobutane), $C_2F_6$, $CHF_3$, $C_6F_8$, or $CH_3F$.

17. The method according to claim 1, wherein the sidewall spacer hard mask comprises a width of about 120 nm or less.

18. The method according to claim 17, wherein patterning the unpatterned layers of the magnetic stack does not result in metal fence formation over the angle of less than about 85° of the sides of the sidewall spacer hard mask.

19. The method according to claim 1, wherein depositing the hard mask comprises depositing about 1500 Angstroms of TiN, Ta, TaN, or combinations thereof.

20. The method according to claim 1, wherein the patterned magnetic stack comprises at least one magnetic tunnel junction (MTJ), wherein the method further comprises:

forming a first insulating layer over the workpiece, before depositing the first magnetic layer;

forming a plurality of first conductive lines in the first insulating layer, the first conductive lines running in a first direction, wherein depositing a first magnetic layer over the workpiece comprises depositing the first magnetic layer over the first insulating layer and the first conductive lines, and wherein the at least one MTJ is disposed over at least one of the plurality of first conductive lines;

forming a second insulating layer over the first insulating layer and the at least one MTJ; and forming a plurality of second conductive lines in the second insulating layer, the second conductive lines running in a second direction, the second direction being different from the first direction.

21. The method according to claim 20, wherein the semiconductor device comprises a field-effect transistor (FET) magnetic random access memory (MRAM) device, wherein the plurality of first conductive lines and the plurality of second conductive lines comprise wordlines and bitlines of the MRAM device, and wherein the at least one MTJ comprises a plurality of magnetic memory cells.

22. The method according to claim 1, wherein patterning at least the second magnetic layer using the hard mask as a mask further comprises patterning a portion of the tunnel insulator; patterning all of the tunnel insulator; patterning all of the tunnel insulator and also a portion of the first magnetic layer; or patterning all of the tunnel insulator and all of the first magnetic layer.

23. A method of making a magnetic memory device, the method comprising:

forming a first magnetic layer over a workpiece;

forming a tunnel insulator over the first magnetic layer;

forming a second magnetic layer over the tunnel insulator;

forming a hard mask over the second magnetic layer, the hard mask, and at least the second magnetic layer cpmprising a first pattern and having sibewalls; and forming a sidewall spacer hard over the sidewalls of at least the hard mask and the second magnetic layer, the sidewall spacer hard mask comprising downwardly sloping sidewalls and comprising a second pattern, wherein forming the sidewall spacer hard mask comprises forming a sidewall spacer hard mask with sides having an angle of less than about 85° with respect to a horizontal surface of the workpiece.

24. The method according to claim 23, wherein the sidewall spacer hard mask comprises at least one material selected from the group consisting of $SiO_2$, SiC, SiCO, SiN, SiCN, $HfO_2$, $HfSiO_x$, $Al_2O_3$, $ZrO_2$, $ZrSiO_x$, $Ta_2O_5$, $La_2O_3$, SiON and combinations thereof.

25. The method according to claim 23, further comprising:

forming a plurality of first conductive lines over the workpiece beneath the first magnetic layer, the plurality of first conductive lines being isolated from one another by a first insulating layer; and forming an antiferromagnetic layer over the plurality of first conductive lines and in contact with the first magnetic layer.

26. The method according to claim 25, wherein the antiferromagnetic layer comprises a first layer and a second layer over the first layer, wherein the first layer comprises a conductive material, wherein the second layer comprises an antiferromagnetic material, and wherein the second layer of the antiferromagnetic layer comprises the second pattern.

27. The method according to claim 26, wherein the first layer of the antiferromagnetic layer comprises a bilayer of Ta and TaN, and wherein the second layer of the antiferromagnetic layer comprises PtMn.

28. The method according to claim 26, wherein the first layer of the antiferromagnetic layer comprises a conductive strap between a first conductive line and the second layer of the antiferromagnetic layer.

29. The method according to claim 28, further comprising:

forming a second insulating layer over the plurality of first conductive lines and the first insulating layer; and forming at least one via formed within the second insulating layer, the at least one via being conductive and coupling the conductive strap to the first conductive line.

30. The method according to claim 26, wherein the first layer of the antiferromagnetic layer comprises the second pattern.

31. The method according to claim 30, further comprising:

forming a conductive strap within a second insulating layer over the plurality of first conductive lines and the first insulating layer, the conductive strap being coupled to the first layer of the antiferromagnetic layer; and forming at least one conductive via between the conductive strap and one of the first conductive lines.

32. The method according to claim 31, wherein the conductive strap is formed beneath the MTJ.

33. The method according to claim 31, wherein the conductive strap is formed beneath a portion of the sidewall spacer hard mask.

34. The method according to claim 31, wherein the conductive via comprises the conductive strap, wherein the conductive via is beneath a portion of the sidewall spacer hard mask, and wherein the conductive via is coupled between the first layer of the antiferromagnetic layer and the first conductive line.

35. The method according to claim 23, wherein the sidewall spacer hard mask comprises a width of about 120 nm or less.

36. The method according to claim 23, wherein depositing the hard mask comprises depositing about 1500 Angstroms of TiN, Ta, TaN, or combinations thereof.

37. The method according to claim 23, further comprising:

forming a first insulating layer over the workpiece;

forming a plurality of first conductive lines within the first insulating layer, the first conductive lines running in a first direction, wherein the first magnetic layer is over the first insulating layer and the first conductive lines such that at least one MTJ is over at least one of the plurality of first conductive lines;

forming a second insulating layer over the first insulating layer and the at least one MTJ; and forming a plurality of second conductive lines within the second insulating layer, the second conductive lines running in a second direction, the second direction being different from the first direction.

* * * * *

UNITED STATES PATENT AND TRADEMARK OFFICE
CERTIFICATE OF CORRECTION

PATENT NO.       : 7,374,952 B2
APPLICATION NO.  : 10/870756
DATED            : May 20, 2008
INVENTOR(S)      : Kasko et al.

It is certified that error appears in the above-identified patent and that said Letters Patent is hereby corrected as shown below:

On the Title Page, Item (75) Inventors, 2nd entry, delete "Sivananda" and insert --Sivanandha--.
In Col. 15, line 31, after sidewalls insert --, wherein sides of the sidewall spacer hard mask comprise an angle of less than about 85° with respect to a horizontal surface of the workpiece--.
In Col. 16, line 57, delete "17" and insert --1--.
In Col. 17, line 9, delete "disposed".
In Col. 17, line 38, delete "cpmprising" and insert --comprising--.
In Col. 17, line 38, delete "sibewalls" and insert --sidewalls--.
In Col. 17, line 39, after hard insert --mask--.

Signed and Sealed this

Nineteenth Day of August, 2008

JON W. DUDAS
*Director of the United States Patent and Trademark Office*